United States Patent
Kim et al.

(10) Patent No.: US 9,871,093 B2
(45) Date of Patent: Jan. 16, 2018

(54) SEMICONDUCTOR DEVICES

(71) Applicant: Samsung Electronics Co., Ltd., Suwon-si, Gyeonggi-do (KR)

(72) Inventors: Kyung-Eun Kim, Seoul (KR); Ki-hyung Nam, Yongin-si (KR); Byung Yoon Kim, Seoul (KR); Bong-Soo Kim, Yongin-si (KR); Eunjung Kim, Daegu (KR); Yoosang Hwang, Suwon-si (KR)

(73) Assignee: Samsung Electonics Co., Ltd. (KR)

( * ) Notice: Subject to any disclaimer, the term of this patent is extended or adjusted under 35 U.S.C. 154(b) by 0 days.

(21) Appl. No.: 15/383,159

(22) Filed: Dec. 19, 2016

(65) Prior Publication Data
US 2017/0236894 A1    Aug. 17, 2017

(30) Foreign Application Priority Data

Feb. 17, 2016   (KR) .................. 10-2016-0018631

(51) Int. Cl.
*H01L 27/108* (2006.01)
*H01L 49/02* (2006.01)

(52) U.S. Cl.
CPC ........ *H01L 28/56* (2013.01); *H01L 27/10808* (2013.01); *H01L 27/10817* (2013.01); *H01L 27/10847* (2013.01); *H01L 27/10852* (2013.01); *H01L 28/75* (2013.01); *H01L 28/82* (2013.01); *H01L 28/88* (2013.01); *H01L 28/90* (2013.01); *H01L 28/92* (2013.01)

(58) Field of Classification Search
CPC ......... H01L 27/10808; H01L 27/10817; H01L 27/10847; H01L 27/10852; H01L 27/11502; H01L 28/82; H01L 28/88; H01L 28/90; H01L 28/92
See application file for complete search history.

(56) References Cited

U.S. PATENT DOCUMENTS

| | | |
|---|---|---|
| 6,673,670 B1 * | 1/2004 | Roberts ............ H01L 27/10855 257/E21.019 |
| 7,635,617 B2 | 12/2009 | Yamazaki |
| 7,869,189 B2 | 1/2011 | Choi et al. |
| 8,043,794 B2 | 10/2011 | Noelscher et al. |
| 8,043,925 B2 | 10/2011 | Yang et al. |
| 8,293,656 B2 | 10/2012 | Kim et al. |
| 9,159,780 B2 * | 10/2015 | Greeley ................. H01L 28/90 |
| 9,224,798 B2 * | 12/2015 | Kiehlbauch ............ H01G 4/33 |

(Continued)

FOREIGN PATENT DOCUMENTS

| | | |
|---|---|---|
| JP | 2008-294417 A | 12/2008 |
| KR | 10-2010-0079828 A | 7/2010 |
| KR | 10-2015-0101312 A | 9/2015 |

*Primary Examiner* — Minh-Loan Tran
(74) *Attorney, Agent, or Firm* — Myers Bigel, P.A.

(57) ABSTRACT

Provided is a semiconductor device. The semiconductor device includes a capacitor structure including a plurality of lower electrodes, a dielectric layer that covers surfaces of the plurality of lower electrodes, and an upper electrode on the dielectric layer. The semiconductor device further includes a support structure that supports the plurality of lower electrodes. The support structure includes a first support region that covers sidewalls of one of the plurality of lower electrodes, and an opening that envelops the first support region when the semiconductor device is viewed in plan view.

20 Claims, 22 Drawing Sheets

(56) References Cited

U.S. PATENT DOCUMENTS

| | | |
|---|---|---|
| 9,324,781 B2* | 4/2016 | Park ................. H01L 28/92 |
| 2009/0184393 A1 | 7/2009 | Chen et al. |
| 2010/0148236 A1* | 6/2010 | Kadoya ............ H01L 27/10814 |
| | | 257/306 |
| 2011/0027963 A1* | 2/2011 | Komeda ........... H01L 27/10814 |
| | | 438/396 |
| 2012/0161281 A1* | 6/2012 | Hasunuma ......... H01L 27/0207 |
| | | 257/532 |
| 2014/0227852 A1 | 8/2014 | Kiehlbauch |
| 2015/0126016 A1 | 5/2015 | Greeley et al. |
| 2015/0243727 A1 | 8/2015 | Park et al. |
| 2016/0020212 A1* | 1/2016 | Kim ................. H01L 27/10814 |
| | | 438/666 |

* cited by examiner

SEMICONDUCTOR DEVICES

CROSS-REFERENCE TO RELATED APPLICATION

This U.S. nonprovisional patent application claims priority under 35 U.S.C. § 119 of Korean Patent Application 10-2016-0018631 filed on Feb. 17, 2016, the entire contents of which is hereby incorporated by reference.

BACKGROUND

The present inventive concept relates to semiconductor devices and, more particularly, to semiconductor devices that include a capacitor.

As semiconductor devices are developed with high integration, capacitors may need to have a high capacitance in a limited area. The capacitance of the capacitor is proportional to a surface area of an electrode and a dielectric constant of a dielectric layer while being inversely proportional to an equivalent oxide thickness of the dielectric layer. Accordingly, to increase the capacitance of the capacitor within a limited area, a three-dimensional capacitor may be provided so that a surface area of the electrode is increased. Also, the capacitance of the capacitor may be increased by reducing the equivalent oxide thickness of the dielectric layer or by using a dielectric layer having a high dielectric constant.

The surface area of an electrode may be increased by increasing height of a lower electrode or a storage electrode, increasing an effective surface area of the lower electrode using a hemi-spherical grain (HSG), or increasing inner and outer surface areas of a cylinder by using a one cylinder storage (OCS) electrode.

SUMMARY

Embodiments of the present inventive concept provide a semiconductor device including an innovative structure configured to support a capacitor.

According to exemplary embodiments of the present inventive concept, a semiconductor device may comprise: a capacitor structure including a plurality of lower electrodes, a dielectric layer that covers surfaces of the plurality of lower electrodes, and an upper electrode on the dielectric layer; and a support structure that supports the plurality of lower electrodes. The support structure may comprise: a first support region that covers sidewalls of a first one of the plurality of lower electrodes; and an opening that envelops the first support region when the semiconductor device is viewed in plan view.

According to exemplary embodiments of the present inventive concept, a semiconductor device may comprise: a capacitor structure including a plurality of lower electrodes, a dielectric layer that covers surfaces of the plurality of lower electrodes, and an upper electrode on the dielectric layer; and a support structure that supports the plurality of lower electrodes. The support structure may comprise: a first support region that covers sidewalls of a first one of the plurality of lower electrodes; a second support region that covers sidewalls of a second one of the plurality of lower electrodes; and an opening between the first support region and the second support region. The opening may separates the first support region and the second support region from each other.

According to exemplary embodiments of the inventive concept, a semiconductor device may comprise: a capacitor structure including a plurality of lower electrodes, a dielectric layer that covers surfaces of the plurality of lower electrodes, and an upper electrode on the dielectric layer; a first support region that contacts a sidewall of a first one of the plurality of lower electrodes and having a polygonal shape when the semiconductor device is viewed in plan view; and a second support region that contacts a sidewall of a second one of the plurality of lower electrodes and surrounding the first support region when the semiconductor device is viewed in plan view.

BRIEF DESCRIPTION OF THE DRAWINGS

The accompanying drawings are included to provide a further understanding of the invention, and are incorporated in and constitute a part of this specification. The drawings illustrate example embodiments of the present invention and, together with the description, serve to explain principles of the present invention. In the drawings:

FIGS. 2A to 10A are plan views illustrating a method for fabricating a semiconductor device according to exemplary embodiments of the present inventive concept;

FIGS. 2B to 10B are cross sectional views taken along line I-I' of FIGS. 2A to 10A, respectively;

DETAILED DESCRIPTION OF EMBODIMENTS

The inventive concept is described more fully hereinafter with reference to the accompanying drawings, in which embodiments of the inventive concept are shown. However, specific structural and functional details disclosed herein are merely representative for purposes of describing example embodiments. Thus, the inventive concepts may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope of the inventive concepts.

Figure 1A:
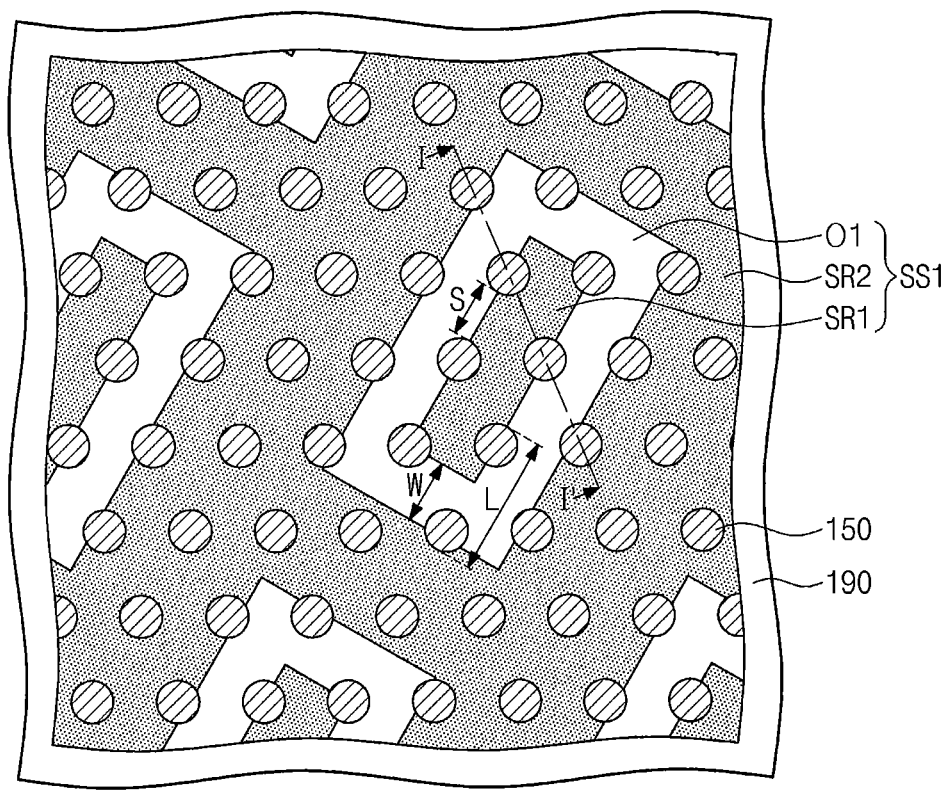
FIG. 1A is a plan view illustrating a semiconductor device according to exemplary embodiments of the present inventive concept.
Figure 1B:
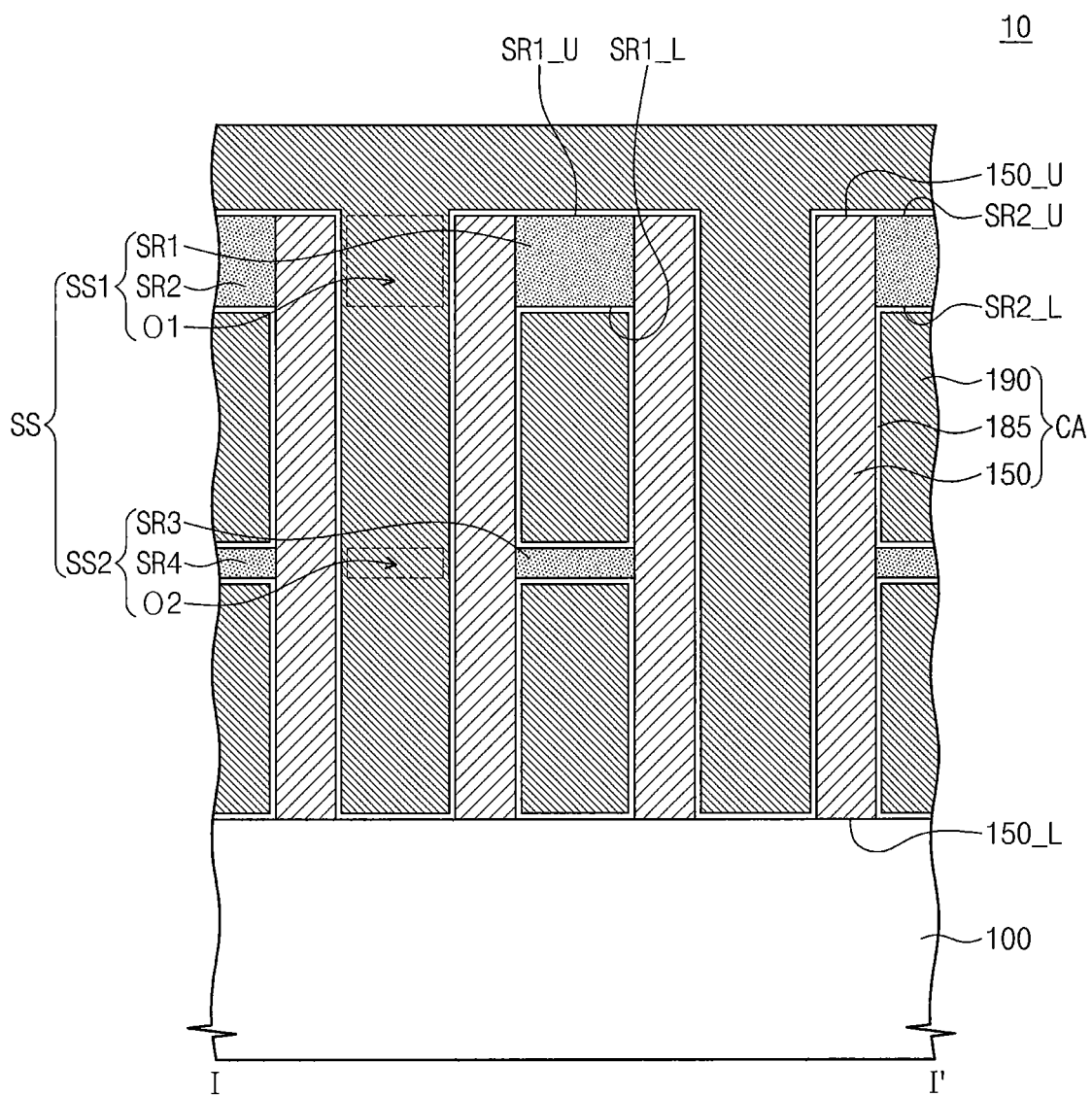
FIG. 1B is a cross-sectional view taken along line I-I' of FIG. 1A.

FIG. 1A is a plan view illustrating a semiconductor device 10 according to exemplary embodiments of the present inventive concept. FIG. 1B is a cross-sectional view taken along line I-I' of FIG. 1A. A semiconductor device 10 may include a lower structure 100, a capacitor structure CA on the lower structure 100, and a support structure SS that structurally support the capacitor CA on the lower structure 100.

Referring to FIGS. 1A and 1B, the capacitor CA may be provided on the lower structure 100. Although not clearly shown in figure, the lower structure 100 may include a semiconductor substrate, semiconductor devices, and/or insulation layers. The semiconductor devices may be disposed on the semiconductor substrate, and the semiconductor devices may include, for example, a MOS transistor, a diode, and a resistor. The lower structure 100 may include a planarized interlayer dielectric layer as an uppermost layer thereof. The capacitor structure CA may include a plurality of lower electrodes 150, a dielectric layer 185, and an upper electrode 190. The capacitor structure CA may include a plurality of capacitors each having the dielectric layer 185 interposed between the lower electrode 150 and the upper electrode 190. The dielectric layer 185 and the upper electrode 190 may be shared by the plurality of capacitors having respective lower electrodes 150, but the present inventive concept is not limited thereto. The plurality of lower electrodes 150 may be provided on the lower structure 100. The plurality of lower electrodes 150 may be two-dimensionally arranged on the lower structure 100. For example, the plurality of the lower electrodes 150 may be provided horizontally spaced apart from one another on the lower structure 100. The lower electrode 150 may have a pillar shape. Alternatively, the lower electrode 150 may have a shape of a hollow cylinder or semi-pillar. The lower electrode 150 may be electrically connected to a switching device (not shown) in the lower structure 100.

The lower electrode 150 may include at least one of a metal layer, a metal nitride layer, and a metal silicide layer. As an example, the lower electrode 150 may be formed of a high melting point metal layer or a refractory metal layer including at least one of cobalt (Co), titanium (Ti), nickel (Ni), tungsten (W), molybdenum (Mo). As another example, the lower electrode 150 may be formed of a metal nitride layer including at least one of titanium nitride (TiN), titanium silicon nitride (TiSiN), titanium aluminum nitride (TiAlN), tantalum nitride (TaN), tantalum silicon nitride (TaSiN), tantalum aluminum nitride (TaAlN), and tungsten nitride (WN). Alternatively, the lower electrode 150 may be formed of a noble metal layer including at least one of platinum (Pt), ruthenium (Ru), and iridium (Ir). Differently, the lower electrode 150 may be formed of a conductive noble oxide layer including at least one of PtO, $RuO_2$ and $IrO_2$, and/or a conductive oxide layer including at least one of $SRO(SrRuO_3)$, $BSRO((Ba,Sr)RuO_3)$, $CRO(CaRuO_3)$, and LSCo.

As capacitance is proportional to a surface area of the lower electrode 150, it may be advantageous for the lower electrode 150 to have an increased height to increase the surface area thereof formed in a limited area. Accordingly, capacitance of the capacitor may become greater with increasing an aspect ratio of the lower electrode 150, i.e., a ratio of height to width of the lower electrode 150. In an embodiment, the support structure SS may be provided to support the lower electrode 150 to avoid the warp or collapse thereof. For example, the support structure SS may be connected to a portion of a sidewall of the lower electrode 150 to horizontally support the lower electrode 150.

The support structure SS may include a plurality of sub-support structures provided at different vertical positions along the lower electrode 150. For example, the support structure SS may include an upper support structure SS1 and a lower support structure SS2 that are positioned at different distances from a bottom surface 150_L of the lower electrode 150. Referring to FIG. 1B, the upper and lower support structures SS1 and SS2 may be vertically spaced apart from each other, and the lower support structure SS2 may be provided between the lower structure 100 and the upper support structure SS1. The upper support structure SS1 may cover upper sidewalls of the lower electrodes 150, and the lower support structure SS2 may cover lower sidewalls of the lower electrodes 150. The upper support structure SS1 may be in contact with the upper sidewalls of the lower electrodes 150, and the lower support structures SS2 may be in contact with the lower sidewalls of the lower electrodes 150. The upper support structure SS1 may have a plurality of first openings O1 at predetermined portions thereof, and the lower support structure SS2 may have a plurality of second openings O2 at predetermined portions thereof. As viewed in plan, the first and second openings O1 and O2 may overlap each other. FIG. 1B shows two support structures SS1 and SS2, but the number of the support structures are not limited thereto.

The upper support structure SS1 may further include a plurality of first support regions SR1 and a second support region SR2 as well as the plurality of the first openings O1. Each of the first support regions SR1 may have an island shape and may be spaced apart from the second support region SR2. For example, as viewed in plan, the first support region SR1 may have a rectangular shape. As shown in FIG. 1A, as viewed in plan, the first opening O1 may envelop the first support region SR1. The first opening O1 may separate the first support region SR1 from the second support region SR2. As viewed in plan, the first opening O1 may have a square ring shape. The first opening O1 may have a substantially uniform width W along its length. The width W of the first opening O1 may be greater than a minimum distance S between the most adjacent two lower electrodes 150 and less than a maximum distance L between the most adjacent two lower electrodes 150. For example, the minimum distance S may correspond to a distance between inner sidewalls of the most adjacent two lower electrodes 150 on an imaginary line passing through centers thereof; similarly, the maximum distance L may correspond to a distance between outer sidewalls of the most adjacent two lower electrodes 150 on the imaginary line passing through centers thereof. Each of the first openings O1 may have an inner sidewall in contact with at least one of the lower electrodes 150. At least one of the lower electrodes 150 may be exposed from each of the first openings O1. As viewed in plan, the second support region SR2 may be provided to envelop the plurality of the first openings 01. The second support region SR2 may envelop the plurality of the first support regions SRl.

A distance from a plane defined by the bottom surfaces 150_L of the lower electrodes 150 to a bottom surface SR1_L of the first support region SR1 may be substantially the same as a distance from the planed defined by the bottom surfaces 150_L of the lower electrodes 150 to a bottom surface SR2_L of the second support region SR2. A distance from the planed defined by bottom surfaces 150_L of the lower electrodes 150 to a top surface SR1_U of the first support region SR1 may be substantially the same as a distance from the planed defined by the bottom surfaces 150_L of the lower electrodes 150 to a top surface SR2_U of the second support region SR2. In other words, the first and second support regions SR1 and SR2 may have substantially the same thickness. Alternatively, the first and second support regions SR1 and SR2 may have different thicknesses from each other.

The first support region SR1 may include a first material, and the second support region SR2 may include a second material. The first material may be identical to or different from the second material. For example, at least one of the first and second materials may include at least one of SiN, SiCN, TaO and TiO2.

The lower support structure SS2 may include a plurality of third support regions SR3 and a fourth support region SR4 as well as the plurality of the second openings O2. The third support regions SR3, the fourth support region SR4, and the second openings O2 may all be configured to have the same shape and function of the first support regions SR1, the second support region SR2, and the first openings O1, respectively, and thus repetitive descriptions thereof will be omitted for the sake of brevity. As shown in FIG. 1B, the lower support structure SS2 may be provided to have a thickness less than that of the upper support structure SS1. As viewed in plan, each of the first openings O1 may be provided to overlap each of the second openings O2, but shapes and the arrangement thereof are not limited thereto.

The dielectric layer 185 may be formed to have a uniform thickness on surfaces of the plurality of the lower electrodes 150. Additionally, the dielectric layer 185 may be formed to have a uniform thickness on surfaces of the upper and lower support structures SS1 and SS2. For example, the dielectric layer 185 may be formed of a single or multiple layer including at least one of a metal oxide, such as $HfO_2$, $ZrO_2$, $Al_2O_3$, $La_2O_3$, $Ta_2O_3$ and $TiO_2$, and a dielectric material having perovskite structure, such as $SrTiO_3$(STO), (Ba,Sr)$TiO_3$(BST), $BaTiO_3$, PZT and PLZT.

The upper electrode 190 may be formed on the dielectric layer 185 to cover the plurality of the lower electrodes 150. The upper electrode 190 may include at least one of impurity doped silicon, metal, metal nitride, and metal silicide. For example, the upper electrode 190 may be formed of a high melting point metal layer or a refractory metal layer including at least one of cobalt (Co), titanium (Ti), nickel (Ni), tungsten (W), molybdenum (Mo). As another example, the upper electrode 190 may be formed of a metal nitride layer including at least one of titanium nitride (TiN), titanium silicon nitride (TiSiN), titanium aluminum nitride (TiAlN), tantalum nitride (TaN), tantalum silicon nitride (TaSiN), tantalum aluminum nitride (TaAlN), and tungsten nitride (WN). Alternatively, the upper electrode 190 may be formed of a noble metal layer including at least one of platinum (Pt), ruthenium (Ru), and iridium (Ir). In other embodiments, the upper electrode 190 may be formed of a conductive noble oxide layer including at least one of PtO, $RuO_2$, and $IrO_2$ and/or a conductive oxide layer including at least one of SRO($SrRuO_3$), BSRO(($Ba,Sr$)$RuO_3$), CRO($CaRuO_3$), and LSCo.

FIGS. 2A to 10A are plan views illustrating a method for fabricating a semiconductor device 10 according to exemplary embodiments of the present inventive concept. FIGS. 2B to 10B are cross sectional views taken along line I-I' of FIGS. 2A to 10A, respectively.

Figure 2A:
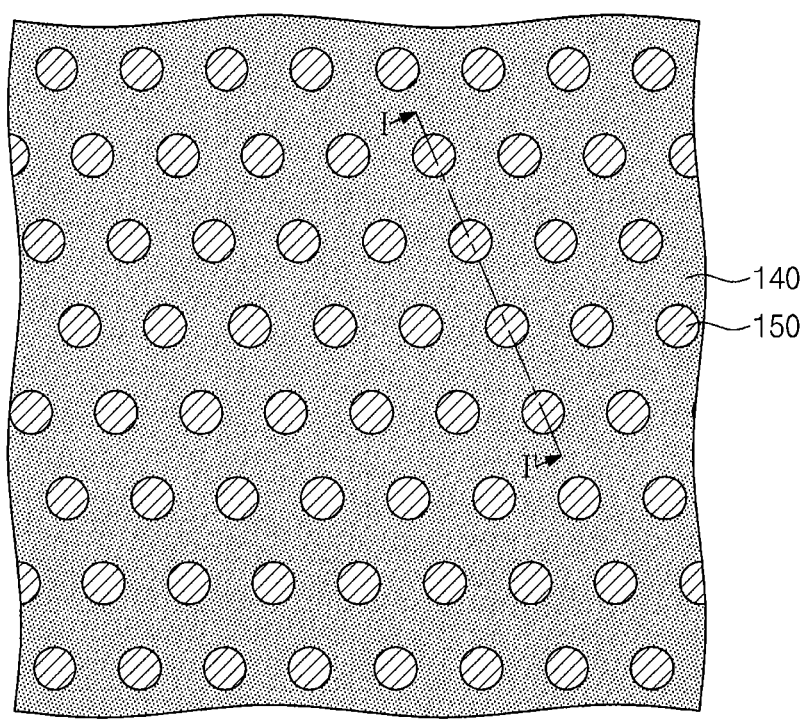
Figure 2B:
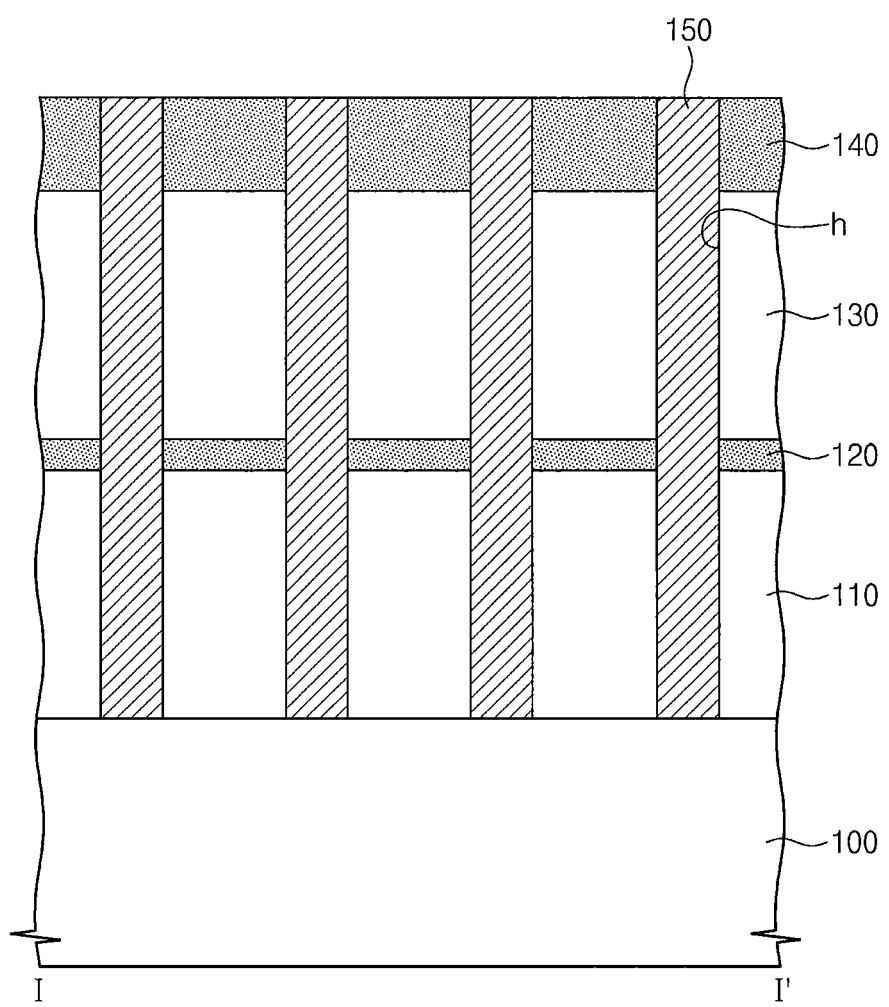

Referring to FIGS. 2A and 2B, a lower mold layer 110, a lower support layer 120, an upper mold layer 130, and an upper support layer 140 may be sequentially formed on a lower structure 100. The lower structure 100 may include a semiconductor substrate, semiconductor devices, and insulation layers. The lower structure 100 may have a planarized interlayer dielectric layer as an uppermost layer thereof. The insulation layers may include HDP (high density plasma) oxide, TEOS (TetraEthylOrthoSilicate), PE-TEOS (Plasma Enhanced TetraEthylOrthoSilicate), $O_3$-TEOS ($O_3$-Tetra Ethyl Ortho Silicate), USG (Undoped Silicate Glass), PSG (PhosphoSilicate Glass), BSG (Borosilicate Glass), BPSG (BoroPhosphoSilicate Glass), FSG (Fluoride Silicate Glass), SOG (Spin On Glass), TOSZ (Tonen SilaZene), or a combination thereof Alternatively, the insulation layers may include at least one of silicon nitride, silicon oxynitride, and a low-k dielectric material. For the convenience of description, the lower mold layer 110 and the upper mold layer 130 may respectively be referred to herein to as a first mold layer 110 and a second mold layer 130, and the lower support layer 120 and the upper support layer 140 may respectively be referred to herein to as a first support layer 120 and a second support layer 140.

The first and second mold layers 110 and 130 may be formed of, for example, a silicon oxide layer. The first and second support layers 120 and 140 may be formed of a material having an etch selectivity with respect to the first and second mold layers 110 and 130. For example, the first and second support layers 120 and 140 may be formed of at least one of SiN, SiCN, TaO and $TiO_2$. As shown in FIG. 2B, the second support layer 140 may be thicker than the first support layer 120. Alternatively, the second support layer 140 may have a thickness substantially the same as that of the first support layer 120. A chemical vapor deposition (CVD) process or a physical vapor deposition (PVD) process may be performed to form each of the first mold layer 110, the first support layer 120, the second mold layer 130, and the second support layer 140.

A plurality of holes h may be formed to penetrate the layers 110, 120, 130 and 140 that are stacked on one another and expose the lower structure 100. For example, a mask pattern (not shown) may be formed to define regions where the holes h are to be formed, and sequentially etching the second support layer 140, the second mold layer 130, the first support layer 120, and the first mold layer 110 using the mask pattern as an etch mask, thereby forming the holes h.

A plurality of lower electrodes 150 may be formed to fill the holes h on the lower structure 100. The lower electrodes 150 may be formed using a layer formation technique having good step coverage property such as a chemical vapor deposition (CVD) process, a physical vapor deposition (PVD) process, an atomic layer deposition (ALD) process, etc. In some embodiments, a lower electrode layer (not shown) may be formed to have a thickness greater than half of a width of the hole h to completely fill the holes h. The lower electrode layer may include at least one of metal, metal silicide, and metal nitride. Thereafter, the lower electrodes 150 may be formed by performing a planarization process on the lower electrode layer until the second support layer 140 is revealed. The planarization process may be performed using, for example, an etch-back process. As the planarization process is performed, the lower electrodes 150 may be formed locally within the holes h and separated from one another.

Figure 3A:
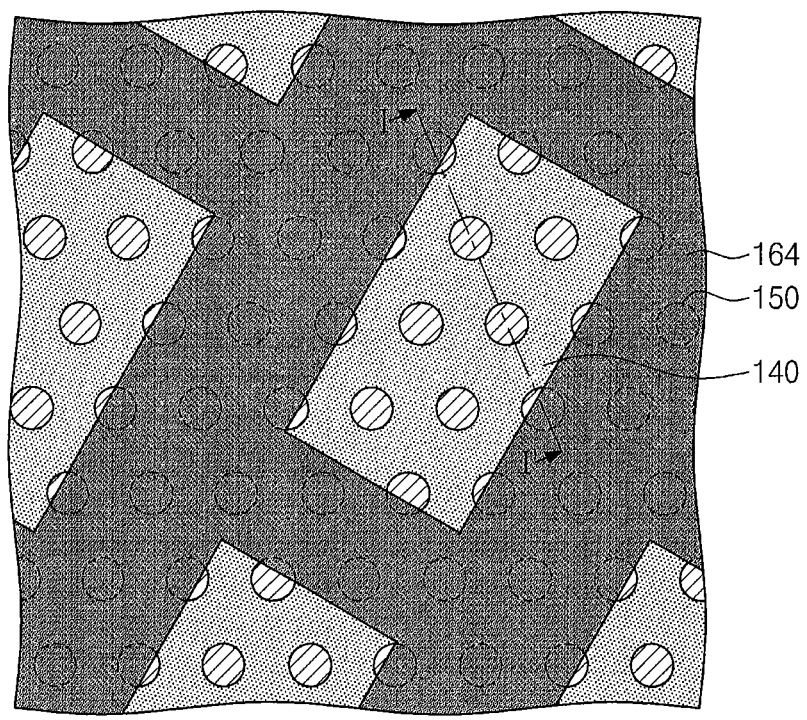
Figure 3B:
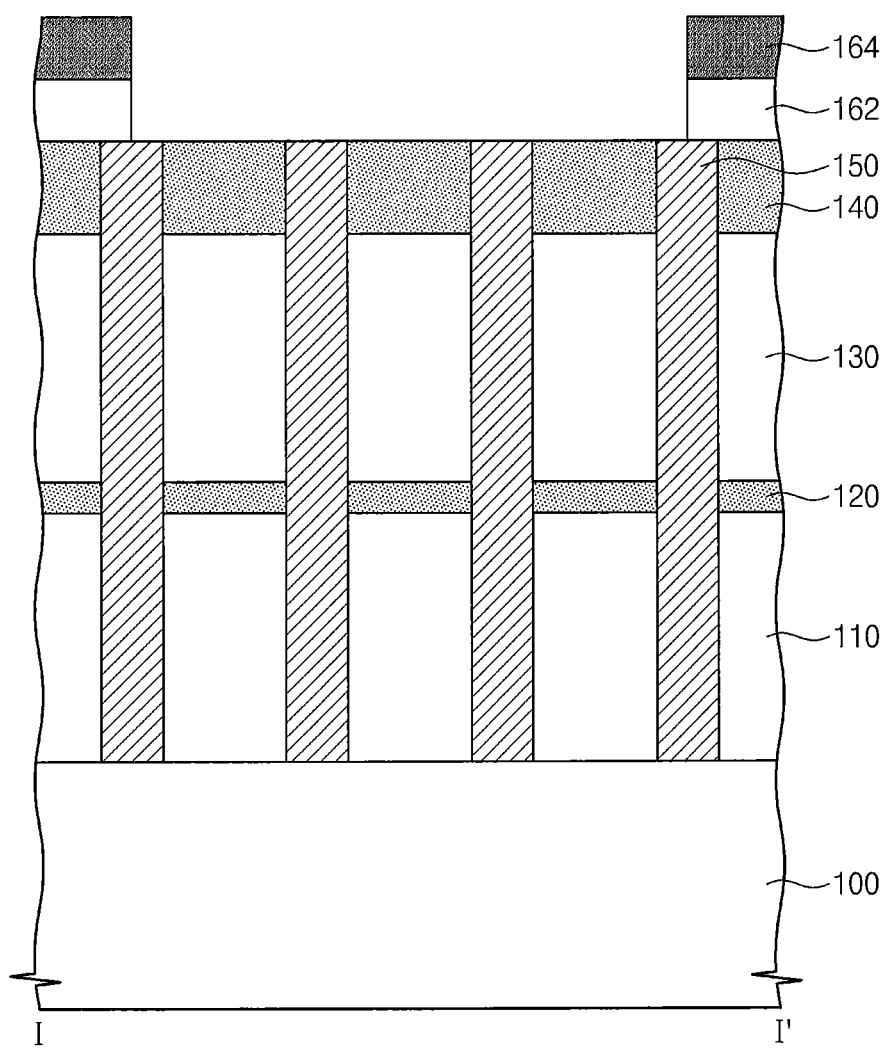

Referring to FIGS. 3A and 3B, an anti-reflective layer (not shown) and a mask layer (not shown) may be sequentially formed on the lower electrodes 150 and the second support layer 140. For example, the anti-reflective layer may include an amorphous carbon layer (ACL). The mask layer may be formed of a material having an etch selectivity with respect to the first and second support layers 120 and 140 and the first and second mold layers 110 and 130. For example, the mask layer may include a photoresist layer. The mask layer may be patterned to form a mask pattern 164. The anti-reflective layer may be etched using the mask pattern 164 as an etch mask, and, thus, an anti-reflective pattern 162 may be formed and the second support layer 140 may be partially exposed. The mask pattern 164 may have a planar shape, which may define a planar shape of the support structure SS discussed above with reference to FIGS. 1A and 1B.

Figure 4A:
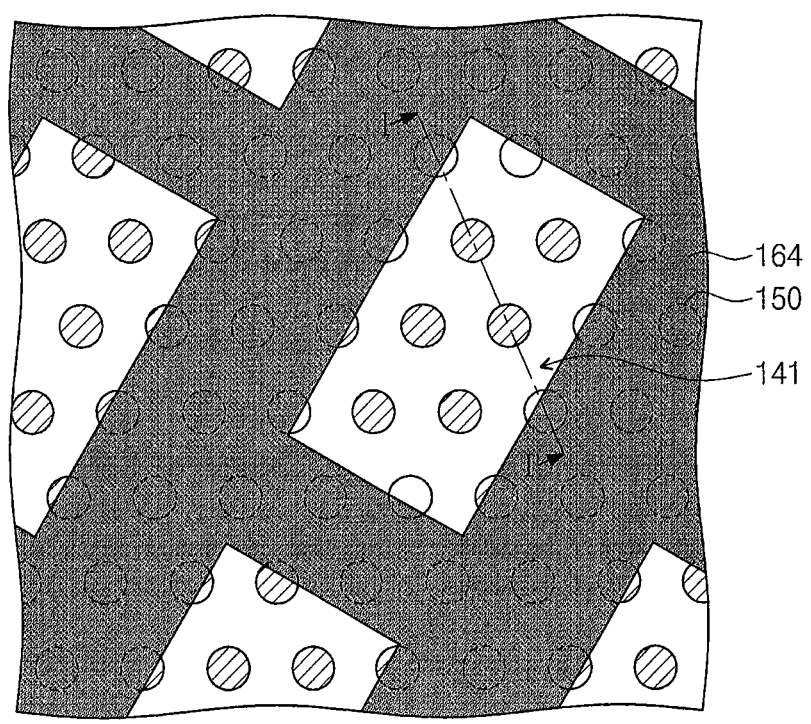
Figure 4B:
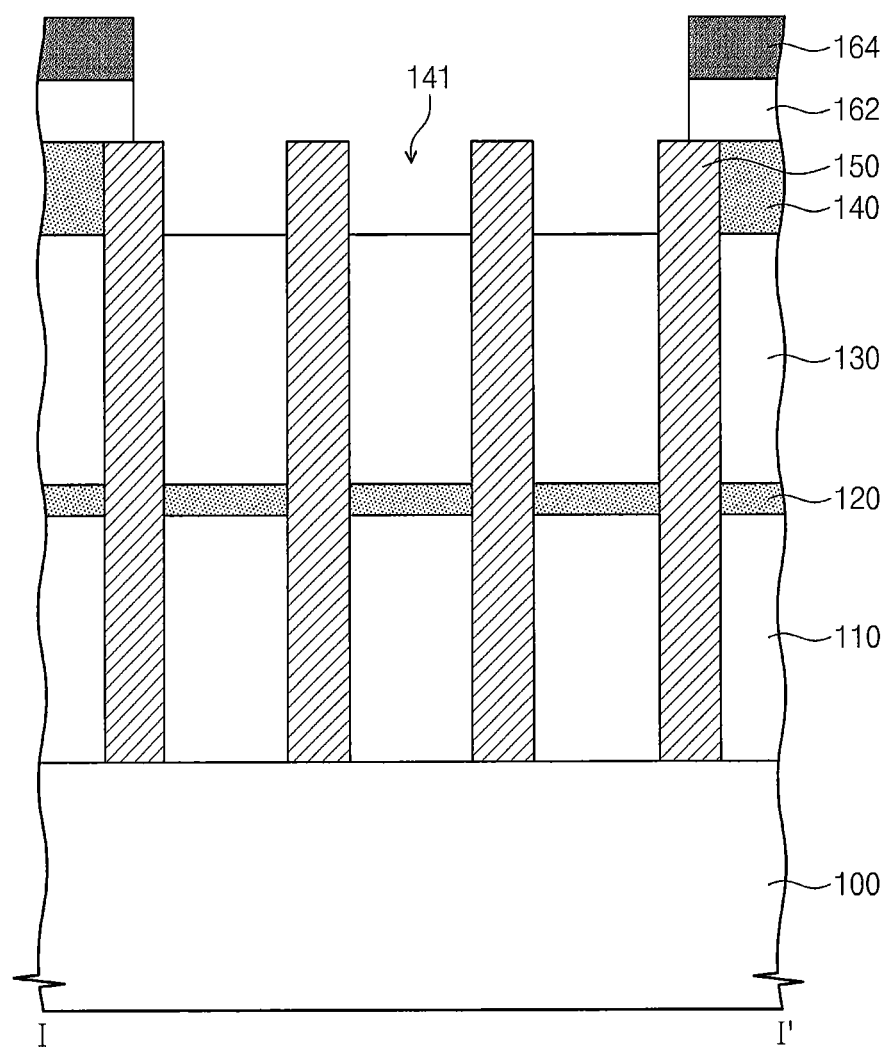

Referring to FIGS. 4A and 4B, an etch process using the mask pattern 164 as an etch mask may be performed on the second support layer 140, which is partially exposed by the mask pattern 164, such that a plurality of first holes 141 may be formed to partially expose the second mold layer 130.

Thereafter, the mask pattern 164 may be removed. For example, the mask pattern 164 may be removed by an ashing process and/or a strip process.

Figure 5A:
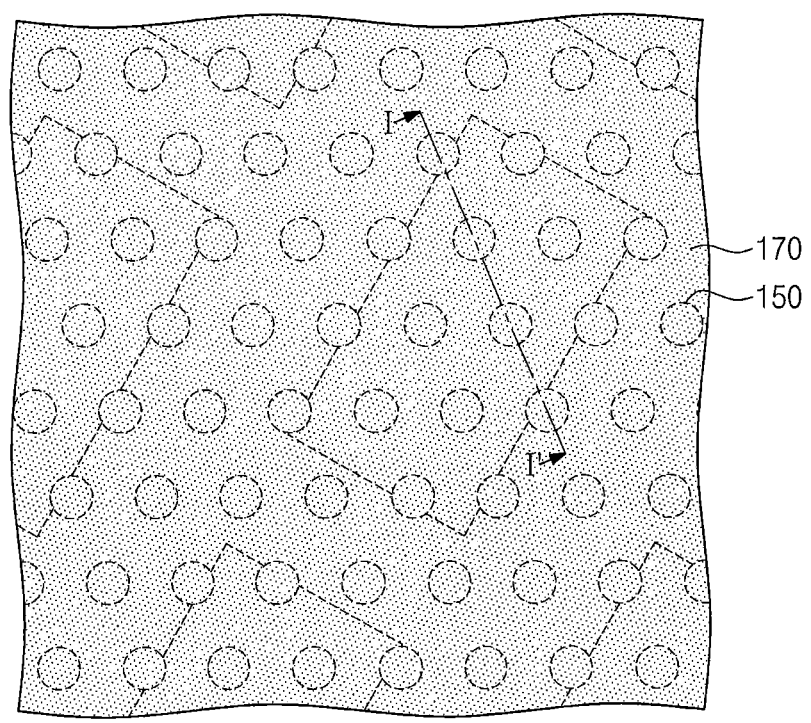
Figure 5B:
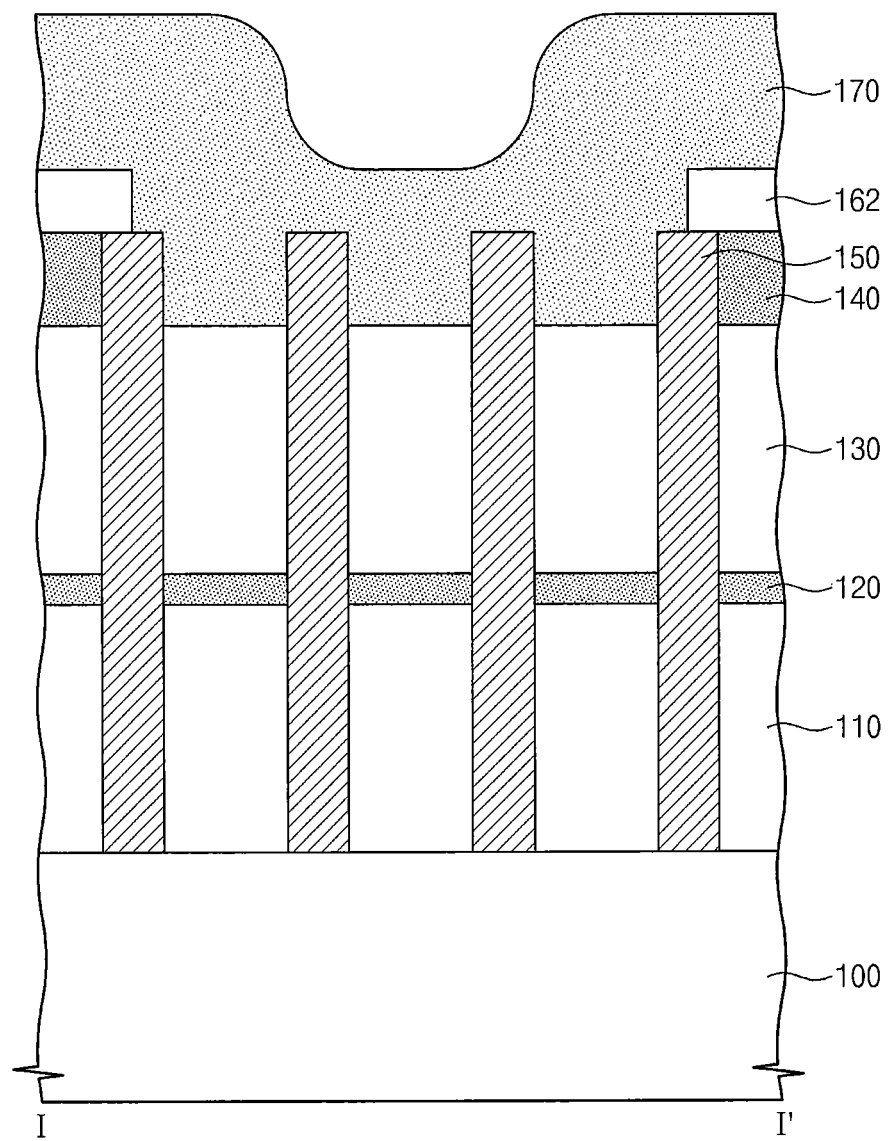

Referring to FIGS. 5A and 5B, a spacer layer 170 may be formed to cover the second mold layer 130 and the lower electrodes 150, which are respectively exposed by the first holes 141. The spacer layer 170 may further cover the anti-reflective pattern 162. For example, the spacer layer 170 may be formed using a layer formation technique having a good step coverage property, such as a chemical vapor deposition (CVD) process, a physical vapor deposition (PVD) process, an atomic layer deposition (ALD) process, etc. The spacer layer 170 may include at least one of oxide, nitride, oxynitride. For example, the spacer layer 170 may be coated so as to be thicker than a distance between the lower electrodes 150.

Figure 6A:
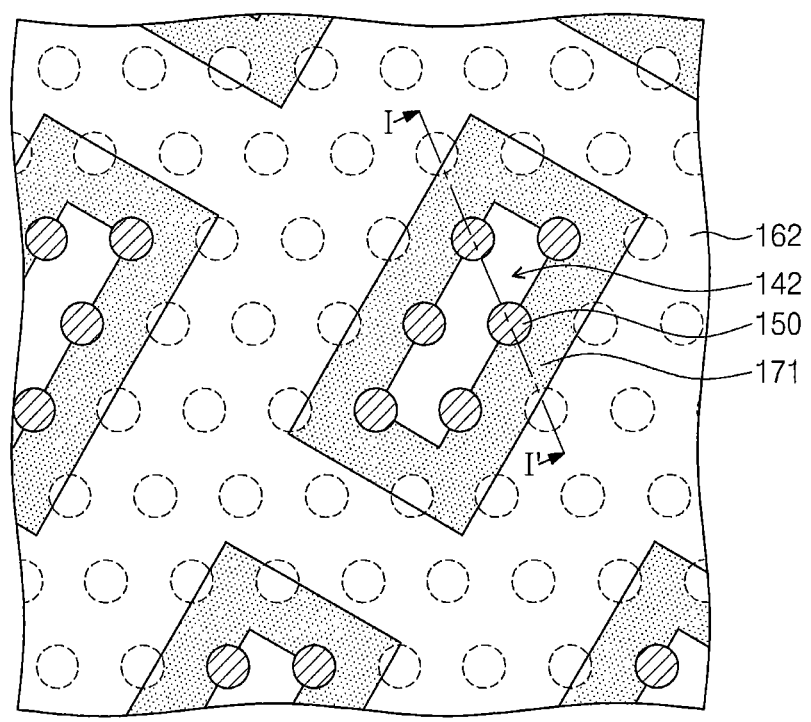
Figure 6B:
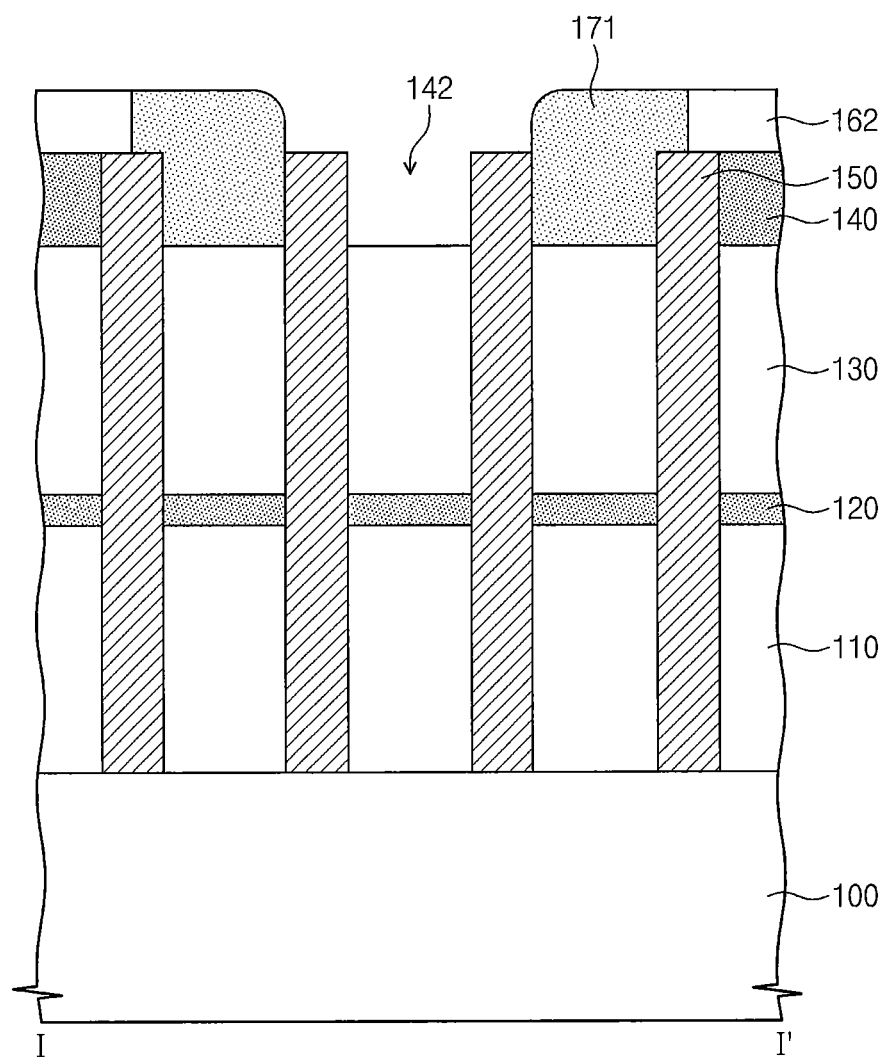

Referring to FIGS. 6A and 6B, the spacer layer 170 may be etched to expose the anti-reflective pattern 162 and the second mold layer 130. At this step, the second holes 142 may be formed to partially expose the second mold layer 130 and a spacer 171 may be formed between the second hole 142 and the anti-reflective pattern 162.

Figure 7A:
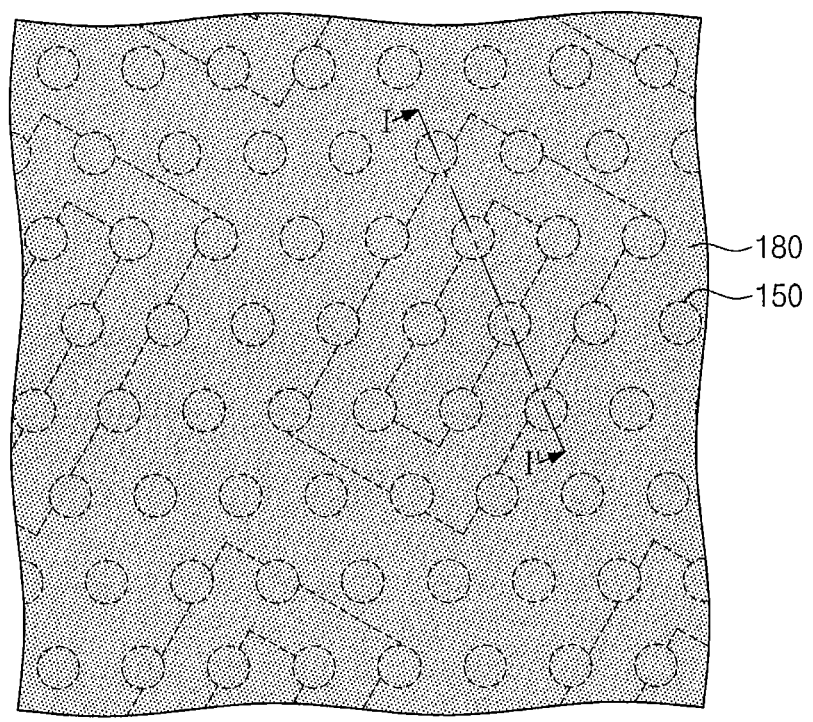
Figure 7B:
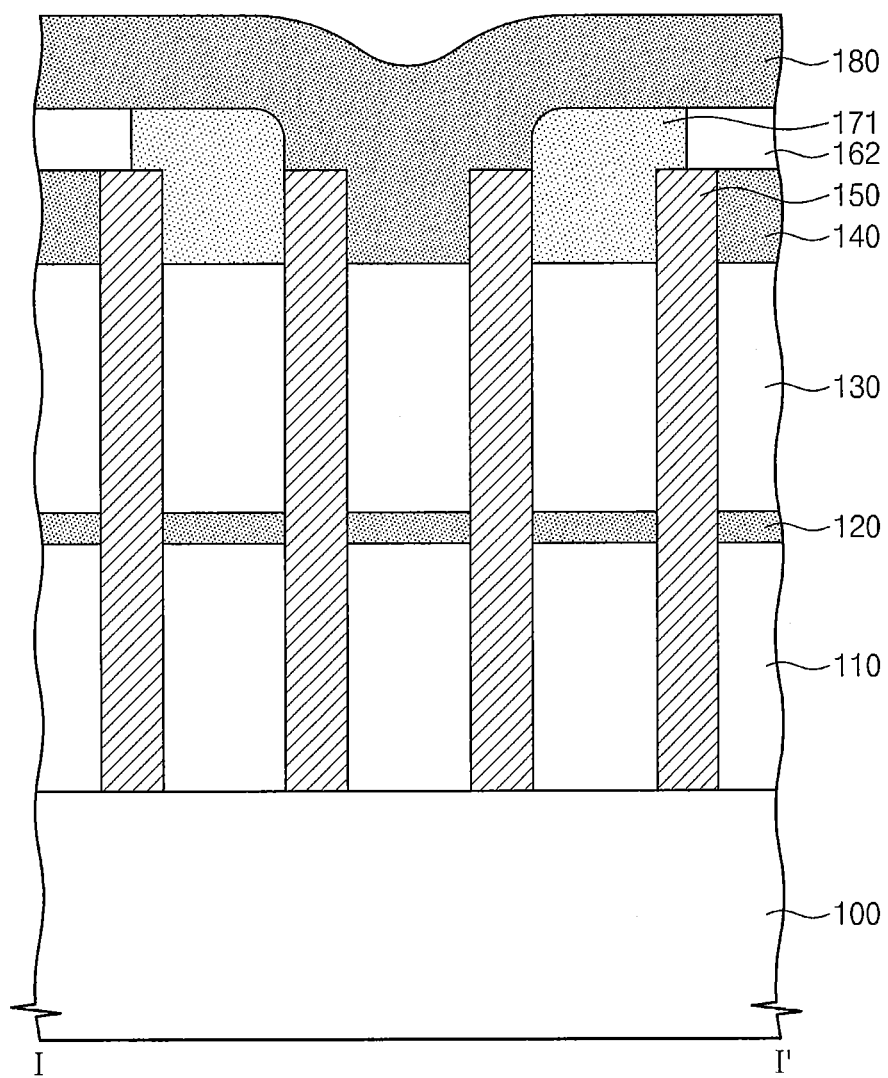

Referring to FIGS. 7A and 7B, a third support layer 180 may be formed on the lower structure 100. The third support layer 180 may cover the second mold layer 130 and the lower electrodes 150, which are respectively exposed by the second holes 142. The third support layer 180 may further cover the spacer 171 and the anti-reflective pattern 162. For example, the third support layer 180 may be formed using a layer formation technique having good step coverage property, such as a chemical vapor deposition (CVD) process, a physical vapor deposition (PVD) process, an atomic layer deposition (ALD) process, etc. The third support layer 180 may include at least one of SiN, SiCN, TaO, and $TiO_2$. The third support layer 180 may include a material identical to or different from that of the second support layer 140. The third support layer 180 may be coated so as to have a thickness substantially the same as or greater than that of the second support layer 140.

Figure 8A:
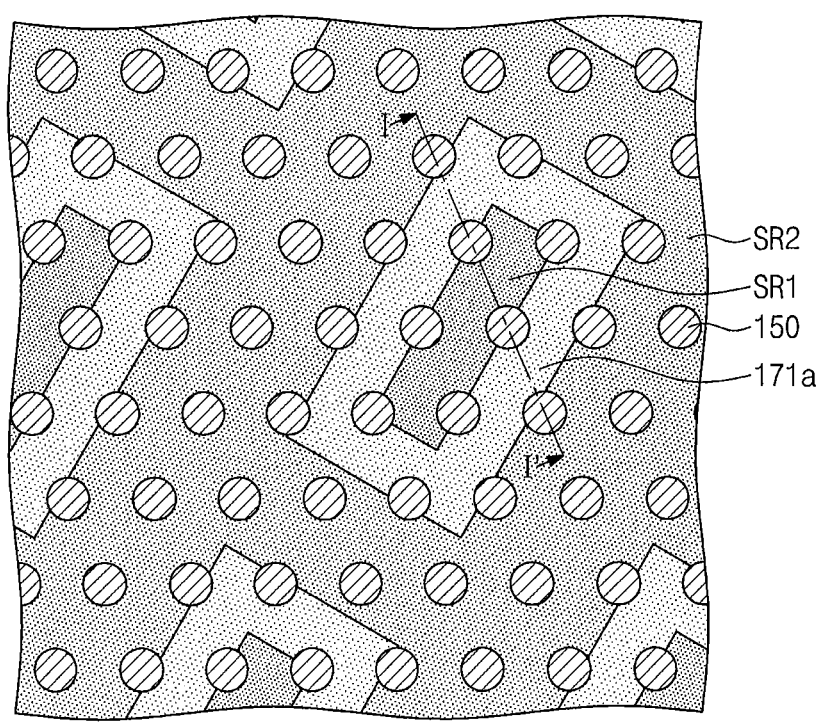
Figure 8B:
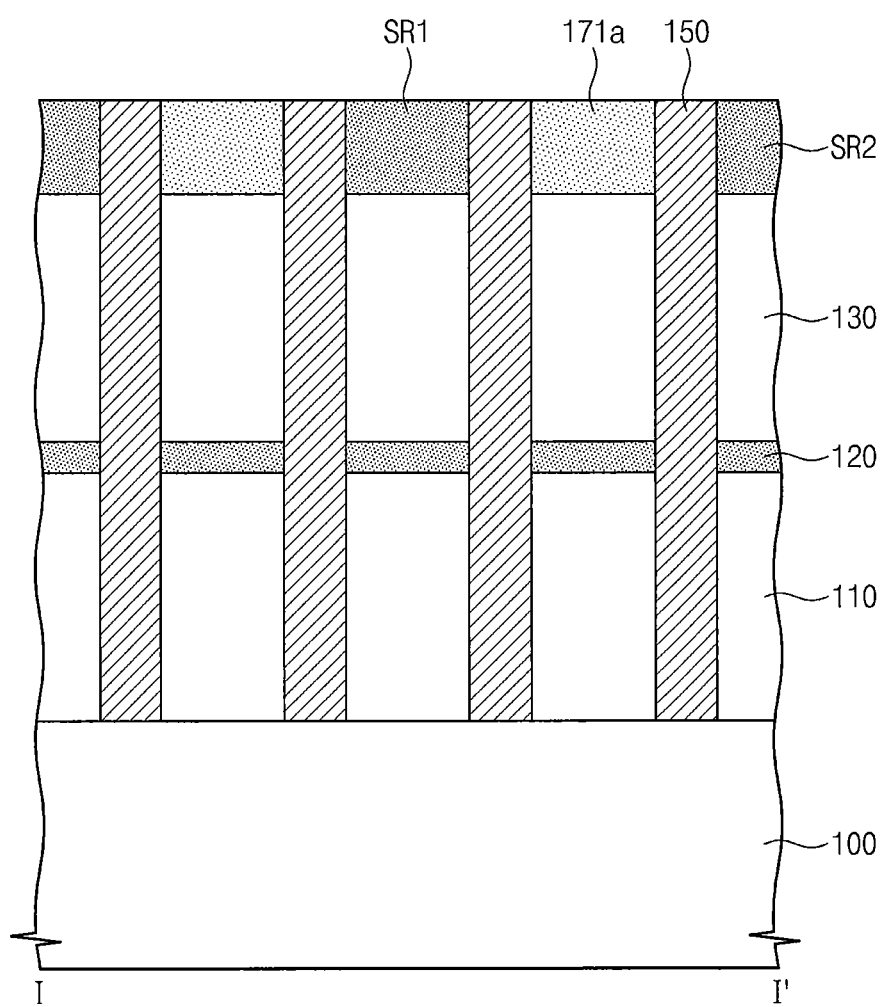

Referring to FIGS. 8A and 8B, a planarization process may be performed on the third support layer 180 until a top surface of the lower electrode 150 is revealed. The planarization process may be performed using, for example, an etch-back process. As the planarization process is performed, a first support region SR1 and a second support region SR2 may be formed. The top surface (designated by the symbol of 150_U of FIG. 1B) of the lower electrode 150 may be coincident with a top surface (designated by the symbol of SR1_U of FIG. 1B) of the first support region SR1 and a top surface (designated by the symbol of SR2_U of FIG. 1B) of the second support region SR2. A remaining spacer 171a may be formed between the first support region SR1 and the second support region SR2, and a top surface of the remaining spacer 171a may be coplanar with the top surface 150_U of the lower electrode 150.

Figure 9A:
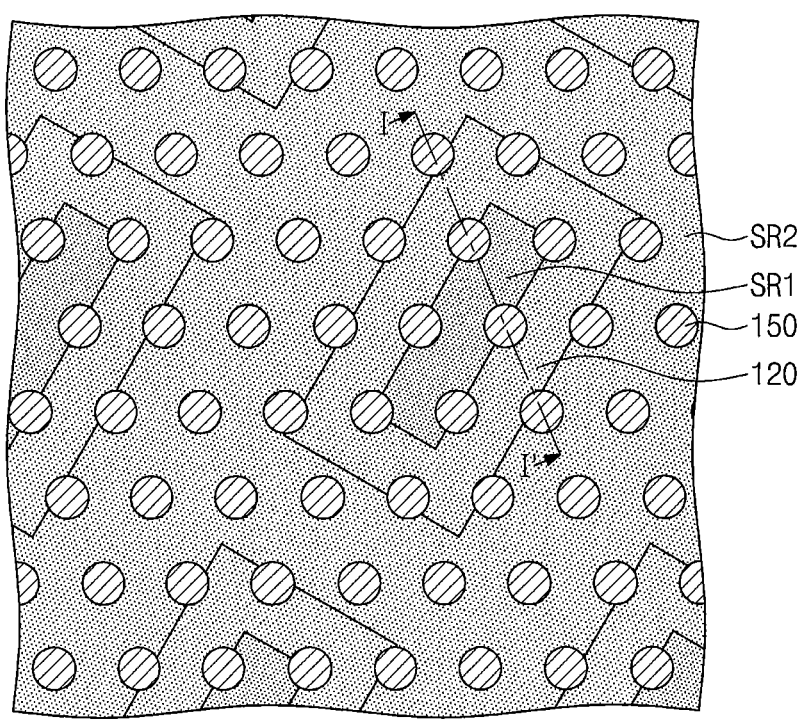
Figure 9B:
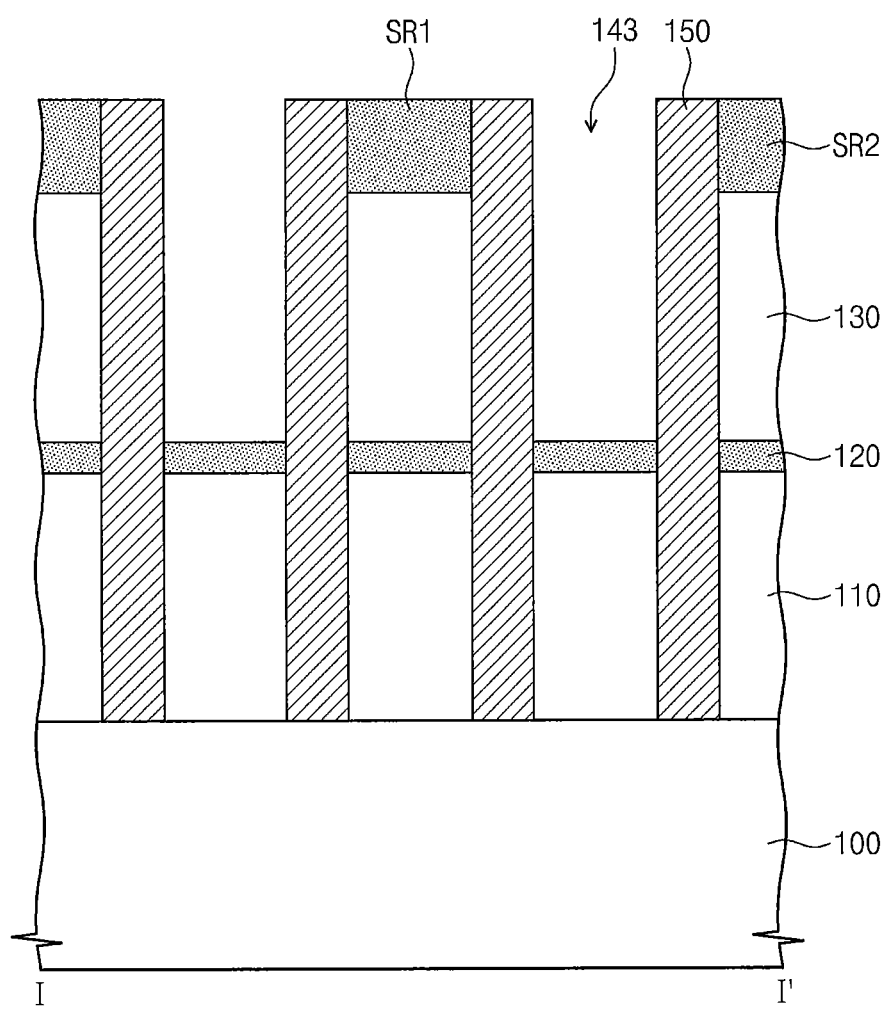

Referring to FIGS. 9A and 9B, the remaining spacer 171a of FIG. 8B and the second mold layer 130 may be sequentially removed. For example, an isotropic etch process may be performed to selectively remove the remaining spacer 171a and the second mold layer 130. When the remaining spacer 171a and the second mold layer 130 are formed of a silicon oxide layer, a wet etch process may be performed using a LAL (limulus amoebocyte lysate) solution as an etchant. Alternatively, when the second mold layer 130 is formed of a silicon nitride layer, the second mold layer 130 may be removed by a wet etch process using a phosphorous acid solution as an etchant. As the remaining spacer 171a and the second mold layer 130 are removed, a plurality of third holes 143 may be formed. The third holes 143 may expose a top surface of the first support layer 120 and sidewalls of the lower electrodes 150.

Figure 10A:
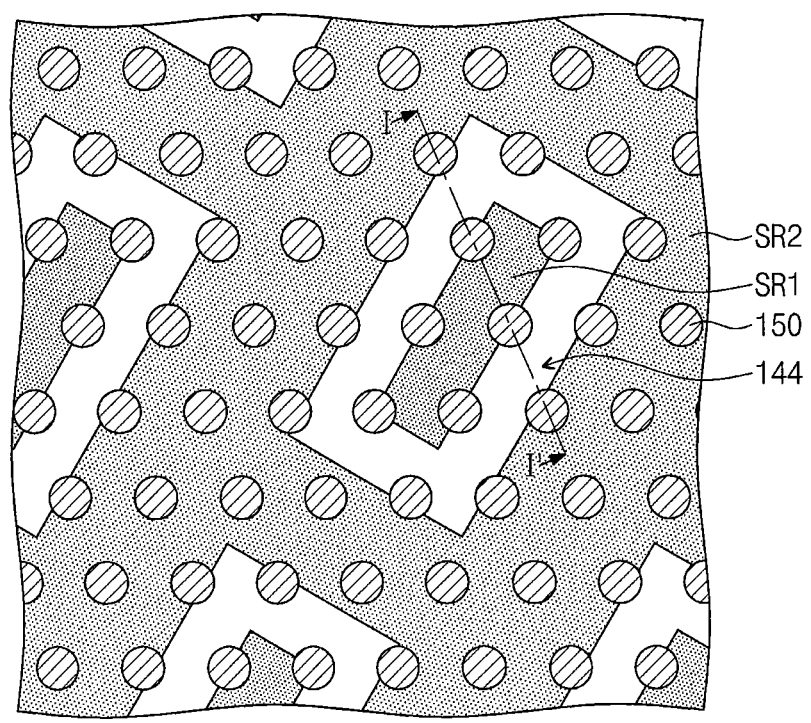
Figure 10B:
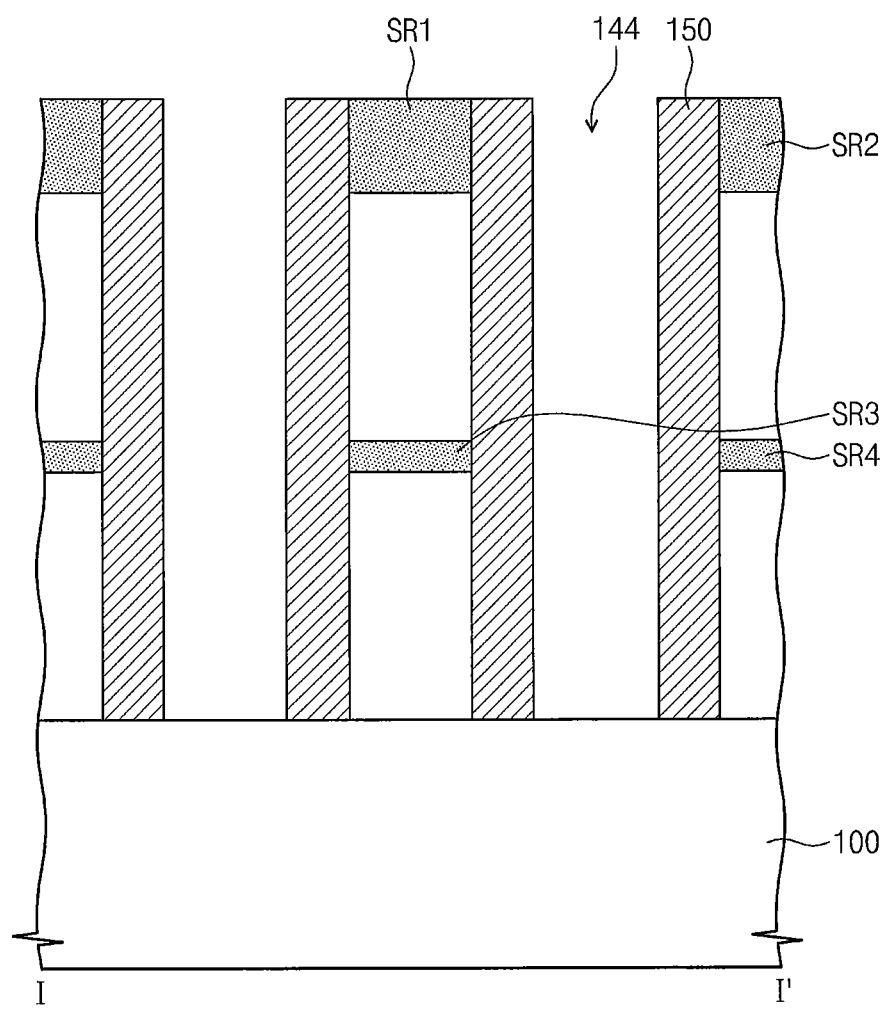

Referring to FIGS. 10A and 10B, the first support layer 120 may be etched using the lower electrodes 150 and the first and second support regions SR1 and SR2 as an etch mask, and thus a third support region SR3 and a fourth support region SR4 may be formed. As viewed in plan, the lower and upper support structure SS1 and SS2 may overlap each other. In addition, as viewed from above, the first opening O1 between the first and second support regions SR1 and SR2 may be aligned with the second opening O2 between the third and fourth support regions SR3 and SR4.

Thereafter, the first mold layer 110 and the second mold layer 130 may be selectively removed using the lower electrodes 150 and the first and second support regions SR1 and SR2 as an etch mask. For example, when the first mold layer 110 and the second mold layer 130 are formed of a silicon oxide layer, a wet etch process may be performed using a LAL (limulus amoebocyte lysate) solution as an etchant. Alternatively, when the first mold layer 110 and second mold layer 130 are formed of a silicon nitride layer, the first mold layer 110 may be removed by an isotropic etch process using a phosphorous acid or the like as an etchant. As the first and second mold layers 110 and 130 and a portion of the first support layer 120 are removed, a plurality of fourth holes 144 may be formed. The fourth holes 144 may expose a top surface of the lower structure 110 and sidewalls of the lower electrodes 150.

Referring back to FIGS. 1A and 1B, a dielectric layer 185 may be formed on a resultant structure in which the first and second mold layers 110 and 130 are removed, and an upper electrode 190 may be formed on the dielectric layer 185.

The dielectric layer 185 may be formed of a single or multiple layer including at least one of a metal oxide, such as $HfO_2$, $ZrO_2$, $Al_2O_3$, $La_2O_3$, $Ta_2O_3$ and $TiO_2$, and a dielectric material having perovskite structure, such as $SrTiO_3$(STO), $(Ba,Sr)TiO_3$(BST), $BaTiO_3$, PZT and PLZT. The upper electrode 190 may include at least one of impurity doped silicon, metal, metal nitride, and metal silicide. For example, the upper electrode 190 may be formed of a high melting point metal layer or a refractory metal layer including at least one of cobalt (Co), titanium (Ti), nickel (Ni), tungsten (W), molybdenum (Mo). As another example, the upper electrode 190 may be formed of a metal nitride layer including at least one of titanium nitride (TiN), titanium silicon nitride (TiSiN), titanium aluminum nitride (TiAlN), tantalum nitride (TaN), tantalum silicon nitride (TaSiN), tantalum aluminum nitride (TaAlN), and tungsten nitride (WN). Alternatively, the upper electrode 190 may be formed of a noble metal layer including at least one of platinum (Pt), ruthenium (Ru), and iridium (Ir). Differently, the upper electrode 190 may be formed of a conductive noble oxide layer including at least one of PtO, $RuO_2$, and $IrO_2$ and/or a conductive oxide layer including at least one of SRO(Sr-$RuO_3$), BSRO((Ba,Sr)$RuO_3$), CRO(Ca$RuO_3$), and LSCo.

The dielectric layer 185 and the upper electrode 190 may be formed using a layer formation technique having a good step coverage property such as a chemical vapor deposition (CVD) process, a physical vapor deposition (PVD) process, an atomic layer deposition (ALD) process, etc.

According to some embodiments of the present inventive concept, a semiconductor device 10 may be provided to include a support structure SS having an innovative shape and structural feature. The foregoing embodiments disclose that a photolithography process is performed one time to form the support structure SS (i.e., referring to FIGS. 3A to 4B), but additional photolithography processes may be further performed as needed. For example, after forming the first and second support regions SR1 and SR2 as described above with reference to FIGS. 8A and 8B, an additional photolithography process may be further performed to adjust shapes and/or sizes of the first and second support regions SR1 and SR2. Accordingly, it may be possible to implement patterning suitable for high integration and miniaturization of the semiconductor device 10 without the limitation of pattern size and/or design in the photolithography process.

Figure 11:
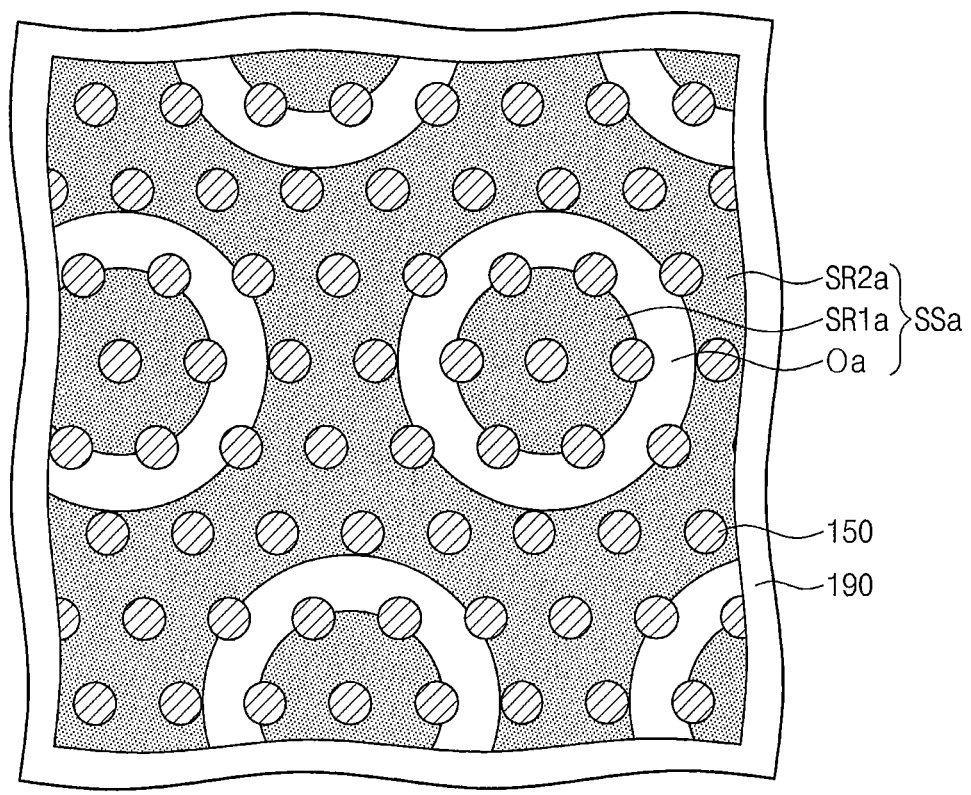
FIG. 11 is a plan view illustrating a semiconductor device according to exemplary embodiments of the present inventive concept.
Figure 12:
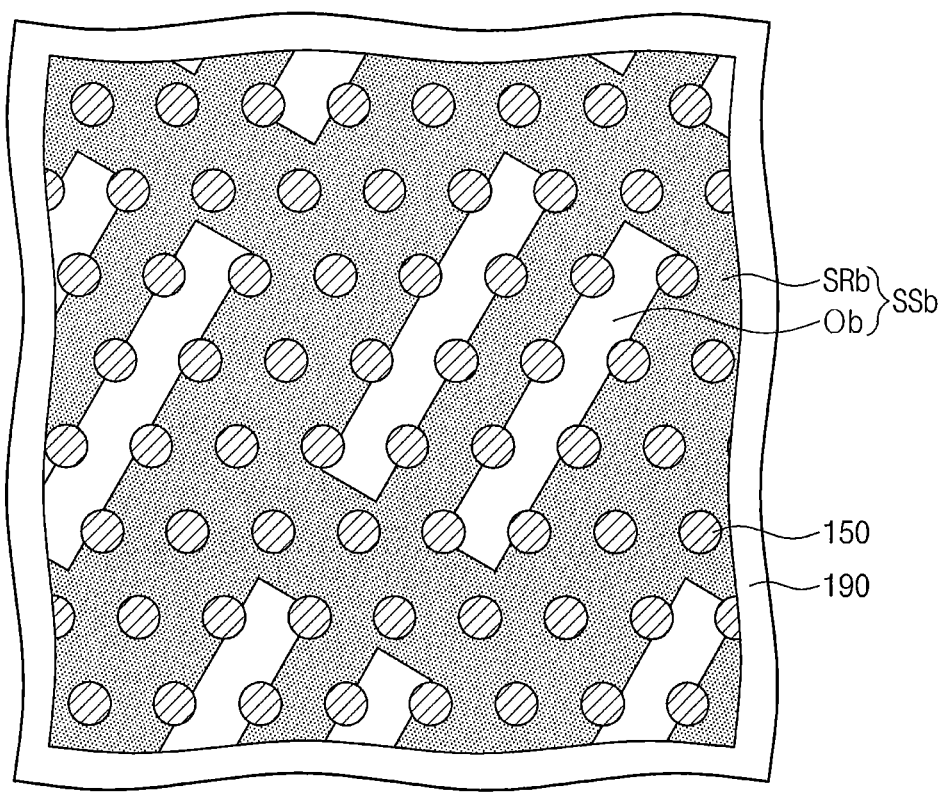
FIG. 12 is a plan view illustrating a semiconductor device according to exemplary embodiments of the present inventive concept.

FIG. 11 is a plan view illustrating a semiconductor device 10a according to exemplary embodiments of the present inventive concept. FIG. 12 is a plan view illustrating a semiconductor device 10a according to exemplary embodiments of the present inventive concept. Elements of the following embodiments substantially the same as those of the semiconductor device 10 described with reference to FIGS. 1A to 10A are allocated the same reference numerals thereto and repeated explanations thereof will be omitted for the sake of brevity. A semiconductor device 10a of FIG. 11 may include a first support region SR1a whose shape is a circle and an opening Oa whose shape is a circular ring that envelops the first support region SR1a, but the shape thereof is not limited thereto. For example, the first support region SR1a and the opening Oa may have various shapes such as a triangle or a parallelogram. A semiconductor device 10b of FIG. 12 may include a support region SRb and an opening Ob each having a bar shape. The support region SRb may be provided to have one single body including a plurality of the openings Ob therein instead of an isolated shape. In other words, the semiconductor device 10b may have no island-shaped support region such as, for example, the first support region SR1 of FIG. 1A. For example, an additional photolithography process may be further performed on the remaining spacer 171a after the first and second support regions SR1 and SR2 are formed at the step of FIGS. 8A and 8B, such that the semiconductor device 10b may be fabricated to include the single-type support region SRb.

According to the present inventive concept, a semiconductor device may be provided to include a support structure having an innovative shape and structural feature.

The effects of the present inventive concept are not limited to the aforementioned effects. Other effects, which are not mentioned above, will be understood by a person skilled in the art from the foregoing descriptions and accompanying drawings.

Although the present invention has been described in connection with the embodiment of the present invention illustrated in the accompanying drawings, it is not limited thereto. It will be apparent to those skilled in the art that various substitution, modifications and changes may be thereto without departing from the scope and spirit of the invention.

What is claimed is:

1. A semiconductor device comprising:
   a capacitor structure comprising a plurality of lower electrodes, a dielectric layer that covers surfaces of the plurality of lower electrodes, and a plurality of upper electrodes on the plurality of dielectric layers, respectively; and
   a support structure that supports the plurality of lower electrodes,
   wherein the support structure comprises:
      a first support region that covers sidewalls of a first one of the plurality of lower electrodes; and
      an opening that envelops the first support region when the semiconductor device is viewed in plan view.

2. The semiconductor device of claim 1, wherein the support structure further comprises a second support region that covers sidewalls of a second one of the plurality of lower electrodes,
   wherein the second support region envelops the opening when the semiconductor device is viewed in plan view.

3. The semiconductor device of claim 2, wherein the first support region comprises a first material and the second support region comprises a second material,
   wherein the first material and the second material are different from each other.

4. The semiconductor device of claim 2, wherein the first support region comprises a first material and the second support region comprises a second material,
   wherein the first material and the second material are substantially the same.

5. The semiconductor device of claim 2, wherein the opening has a substantially uniform width along its length.

6. The semiconductor device of claim 2, wherein a distance from a plane defined by bottom surfaces of the lower electrodes to a bottom surface of the first support region is substantially the same as a distance from the plane defined by the bottom surfaces of the lower electrodes to a bottom surface to the second support region.

7. The semiconductor device of claim 2, wherein a distance from a plane defined by bottom surfaces of the lower electrodes to a top surface of the first support region is substantially the same as a distance from the plane defined by the bottom surfaces of the lower electrodes to a top surface of the second support region.

8. The semiconductor device of claim 1, wherein the support structure is a first support structure and the semiconductor device further comprises:
   a second support structure that supports the plurality of lower electrodes at a different height than the first support structure relative to bottom surfaces of the lower electrodes.

9. A semiconductor device comprising:
   a capacitor structure comprising a plurality of lower electrodes, a dielectric layer that covers surfaces of the plurality of lower electrodes, and an upper electrode on the dielectric layer; and
   a support structure that supports the plurality of lower electrodes,
   wherein the support structure comprises:
      a first support region that covers sidewalls of a first one of the plurality of lower electrodes;
      a second support region that covers sidewalls of a second one of the plurality of lower electrodes; and
      an opening between the first support region and the second support region,
   wherein the opening separates the first support region and the second support region from each other.

10. The semiconductor device of claim 9, wherein a distance from a plane defined by bottom surfaces of the lower electrodes to a bottom surface of the first support region is substantially the same as a distance from the plane defined by the bottom surfaces of the lower electrodes to a bottom surface to the second support region.

11. The semiconductor device of claim 10, wherein the opening envelops the first support region when the semiconductor device is viewed in plan view.

12. The semiconductor device of claim 11, wherein the second support region envelops the opening when the semiconductor device is viewed in plan view.

13. The semiconductor device of claim 10, wherein the opening has a substantially uniform width along its length.

14. The semiconductor device of claim 9, wherein the first support region comprises a first material and the second support region comprises a second material,
wherein the first material and the second material are different from each other.

15. The semiconductor device of claim 9, wherein the first support region comprises a first material and the second support region comprises a second material,
wherein the first material and the second material are substantially the same.

16. A semiconductor device comprising:
a capacitor structure comprising a plurality of lower electrodes, a dielectric layer that covers surfaces of the plurality of lower electrodes, and an upper electrode on the dielectric layer;
a first support region that contacts a sidewall of a first one of the plurality of lower electrodes and having a polygonal shape when the semiconductor device is viewed in plan view; and
a second support region that contacts a sidewall of a second one of the plurality of lower electrodes and surrounding the first support region when the semiconductor device is viewed in plan view.

17. The semiconductor device of claim 16, wherein the first support region and the second support region are separated from each other by an opening.

18. The semiconductor device of claim 16, wherein the first support region and the second support region comprise a first support structure, the semiconductor device further comprising a second support structure comprising:
a third support region that contacts the sidewall of the first one of the plurality of lower electrodes and having the polygonal shape when the semiconductor device is viewed in plan view; and
a fourth support region that contacts the sidewall of the second one of the plurality of lower electrodes and surrounding the first support region when the semiconductor device is viewed in plan view.

19. The semiconductor device of claim 18, wherein the first support structure overlaps the second support structure when the semiconductor device is viewed in plan view.

20. The semiconductor device of claim 18, wherein the first support structure and the second support structure are disposed at different heights relative to a plane defined by bottom surfaces of the lower electrodes.

* * * * *